United States Patent
Lee

(10) Patent No.: US 7,005,383 B2
(45) Date of Patent: Feb. 28, 2006

(54) APPARATUS AND METHODS OF CHEMICAL MECHANICAL POLISHING

(75) Inventor: Ji Myong Lee, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 141 days.

(21) Appl. No.: 10/733,067

(22) Filed: Dec. 11, 2003

(65) Prior Publication Data

US 2004/0127051 A1    Jul. 1, 2004

(30) Foreign Application Priority Data

Dec. 30, 2002  (KR) ............... 10-2002-0086888

(51) Int. Cl.
*H01L 21/461* (2006.01)
(52) U.S. Cl. .................... 438/692; 438/959
(58) Field of Classification Search ............. 438/692, 438/959
See application file for complete search history.

(56) References Cited

U.S. PATENT DOCUMENTS

| | | | | |
|---|---|---|---|---|
| 5,308,438 A | * | 5/1994 | Cote et al. ............... 216/86 |
| 5,823,854 A | * | 10/1998 | Chen ..................... 451/9 |
| 5,906,532 A | * | 5/1999 | Nakajima et al. ......... 451/41 |
| 6,121,143 A | * | 9/2000 | Messner et al. .......... 438/692 |
| 6,194,317 B1 | * | 2/2001 | Kaisaki et al. .......... 438/692 |
| 6,352,469 B1 | * | 3/2002 | Miyazaki et al. ......... 451/67 |
| 6,368,200 B1 | * | 4/2002 | Merchant et al. ........ 451/527 |
| 6,468,134 B1 | * | 10/2002 | Gotkis ................. 451/36 |
| 6,899,601 B1 | * | 5/2005 | Boyd .................. 451/56 |
| 2002/0077034 A1 | * | 6/2002 | Tolles ................. 451/41 |
| 2004/0118051 A1 | * | 6/2004 | Shiho et al. ........... 51/295 |
| 2004/0214512 A1 | * | 10/2004 | Grunwald .............. 451/41 |
| 2004/0224622 A1 | * | 11/2004 | Sakurai et al. ......... 451/526 |

* cited by examiner

*Primary Examiner*—Amir Zarabian
*Assistant Examiner*—Toniae M. Thomas
(74) *Attorney, Agent, or Firm*—Hanley, Flight & Zimmerman, LLC

(57) ABSTRACT

Disclosed are apparatus and methods of chemical mechanical polishing a semiconductor wafer to minimize formation of scratches on a surface of a wafer. According to one example, a method of planarizing a pattern of a wafer by rotating the wafer that is fixed to a carrier head, on a polishing pad by pressing the wafer against the polishing pad and injecting slurry onto the polishing pad is disclosed. The method may include performing a first planarization process by injecting the slurry onto the polishing pad and rotating the wafer as the wafer contacts the polishing pad and performing a second planarization process during which the wafer is spaced apart from the polishing pad at a given spacing, wherein air is injected into the polishing pad to produce bubbles in the slurry on the polishing pad while the wafer is rotated.

5 Claims, 4 Drawing Sheets

APPARATUS AND METHODS OF CHEMICAL MECHANICAL POLISHING

TECHNICAL FIELD

The present disclosure relates to semiconductor manufacturing and, more particularly, to apparatus and methods of chemical mechanical polishing.

BACKGROUND

Generally, a chemical mechanical polishing (CMP) apparatus, which utilizes a polishing pad and slurry to polish a wafer, is used for planarization of insulating material through wide area on a semiconductor wafer. The need for CMP is due to trends toward high integration and high speed semiconductor devices.

The wafer is attached to a lower surface of a carrier head capable of being rotated and horizontally fluctuated. The wafer is in contact with a rotating polishing pad and, therefore, the wafer is mechanically polished by its own weight, the weight of the carrier head, and applied pressure. The horizontal fluctuation of the wafer is defined as a straight reciprocation along a center and circumference of the polishing pad.

While the wafer is rotated on the carrier head, a polishing solution, i.e., a slurry, is supplied onto the polishing pad. The slurry flows into a fine gap between the wafer and the polishing pad. In other words, the polishing solution flows into pores of the polishing pad, thereby inducing a chemical reaction and thus chemically polishing the wafer.

As the polishing process progresses, the polishing rate of the wafer per unit hour is reduced. Accordingly, the polishing speed becomes slow. To prevent the reduction in polishing speed, a disc-type pad conditioner, to which a number of diamonds having a dimension of 100 to 200 $\mu$m is attached, is forcibly contacted with the upper surface of the polishing pad to recover a surface condition of the polishing pad. This process is referred to as pad conditioning.

A conventional CMP apparatus will now be described in conjunction with FIG. 1. The conventional CMP apparatus includes a carrier head 110, fixing a wafer 103 by absorption power. The carrier head 110 includes an adhesive carrier film (not shown) attached to a center of the lower surface of the carrier head 110. The wafer 103 is adhered and fixed to the lower surface of the carrier film and a ring-type retaining ring 111 is adhered to the lower surface of the carrier head 110 around the carrier film and wafer 103. The carrier head 110 is coupled to a driving means (not shown).

The retaining ring 111 serves to prevent the wafer 103 fixed to the carrier film from being detached from the carrier head 110 during the polishing process. In addition, the retaining ring 111 serves to displace vertical pressure acting on a center of the carrier head 110 onto a periphery of the carrier head 110.

A rotary turntable 101 is located at a position spaced apart from the lower portion of the carrier head 110, and a polishing pad 102 made of polyurethane is attached to an upper surface of the rotary turntable 101. The rotary turntable 101 is provided with a slurry-injecting nozzle 130 spaced apart from the upper surface of the rotary turntable 101 for supplying the slurry during the polishing process. A pad conditioner 120 is installed in a proper position above the polishing pad 102, independently of the carrier head 110.

When the polishing process of the wafer 103 is started, the rotary turntable 101 is rotated, with the polishing pad 102 being attached to the upper surface of the rotary turntable.

The carrier head 110 is moved downwardly until the wafer 103 is in contact with the polishing pad 102. When the wafer is in contact with the polishing pad, the carrier head 110 is rotated and horizontally fluctuated by the driving means (not shown).

At the same time, the slurry is injected onto the polishing pad 102 from the slurry-injecting nozzle 130 to induce the chemical reaction between the slurry and the wafer, thereby achieving the chemical polishing in addition to the mechanical polishing.

After completing the polishing process for the wafer 103, or during performing the polishing process, the pad conditioning process is performed to increase polishing degree of the polishing pad 102. The pad conditioner 120 installed above the upper portion of the rotary turntable 101 is connected to a driving means, independently of the carrier head 110. Accordingly, the pad conditioner 120 is rotated to be forcibly in contact with the polishing pad 102, thereby recovering the surface condition of the polishing pad.

In the course of performing the CMP process, the wafer 103 has to be in contact with the polishing pad 102, and it necessarily requires mechanical action, such as rotation. Therefore, there is a problem of wafer scratching.

Explaining the actual process as an example, as shown in FIG. 4, an insulating layer 402 having a via hole 403 is formed on a semiconductor substrate 401. In this state, a metal layer 404 is deposited on the insulating layer 402 to sufficiently fill the via hole 403, the CMP process is performed to the metal layer to form a plug in the via hole 403. At that time, an end point (a point C of FIG. 4) of the planarization is a surface of the insulating layer. In other words, the surface of the insulating layer is planarized to form the plug in the via hole 403.

For performing the CMP process, the polishing pad of the CMP apparatus is closely in contact with the metal layer or insulating layer until the surface of the insulating layer 402 is exposed, thereby potentially forming scratches on the surface of the insulating layer.

DETAILED DESCRIPTION

Figure 1:
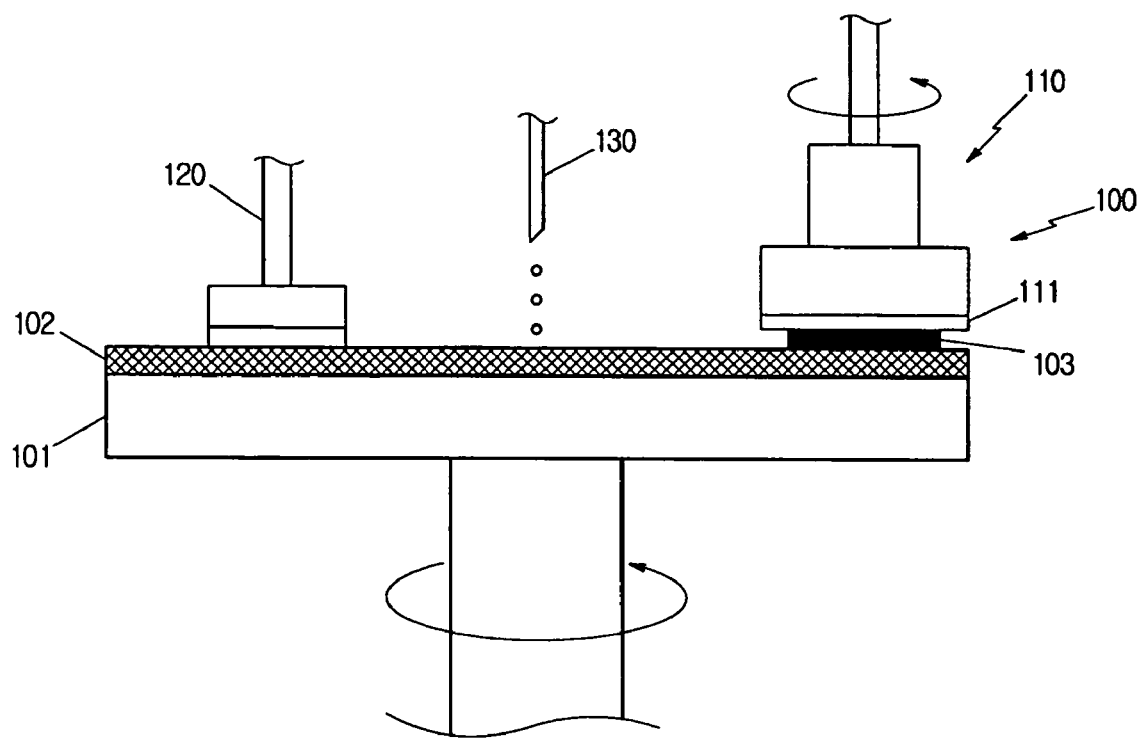
FIG. 1 illustrates a conventional chemical mechanical polishing apparatus.
Figure 2:
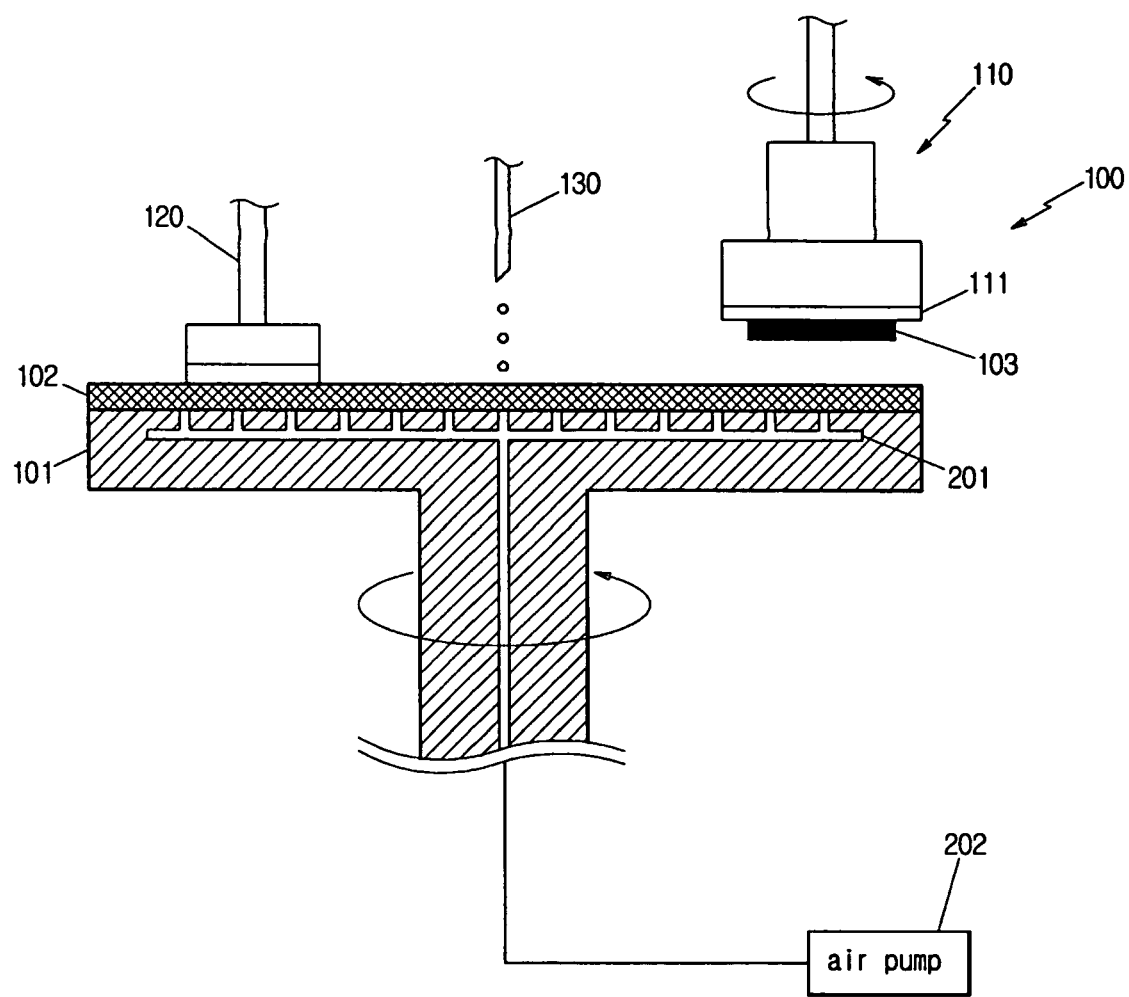
FIG. 2 illustrates an example of a chemical mechanical polishing apparatus.

FIG. 2 illustrates an example CMP apparatus disclosed herein. As shown in FIG. 2, the CMP apparatus 100 includes a rotary turntable 101 providing a space in which a process of polishing a wafer 103 is performed. The rotary turntable 101 is rotated at a given speed when performing the CMP process to smoothly perform the polishing process.

The rotary turntable 101 is provided on an upper surface thereof with a polishing pad 102. The polishing pad 102 may be made of material such as polyurethane or Poly-Tex. The hardness and density properties of the polishing pad 102 may be selected according to material of a surface to be polished. The polishing pad 102 has a porous characteristic, such as that of a sponge. The rotary turntable 101 includes an air inlet tube 201 at a proper position therein. One end of the air inlet tube 201 is connected to an air pump 202, so that air supplied from the air pump 202 is injected into a lower part of the polishing pad 102 connected to the other end of the air inlet tube 201. The air injected into the lower part of the polishing pad 102 passes through the polishing pad 102 due to the porous characteristic thereof and, then, is emitted through an upper part of the polishing pad 102. The air, emitted through the upper part of the polishing pad 102, flows into the slurry, which is injected onto the polishing pad 102 during CMP process, to produce bubbles.

Also, the polishing pad 102 includes on the upper part thereof a carrier head 110 sucking and fixing the wafer 103. The carrier head 110 includes an adhesive carrier film attached to a center of the lower surface of the carrier head 110, the wafer 103 adhered and fixed to a lower surface of the carrier film, and a ring-type retaining ring 111 adhered to the lower surface of the carrier head 110 to be installed around the carrier film and wafer 103. The carrier head 110 is coupled to a driving means (not shown).

A slurry-injecting nozzle 130 is located at a position spaced apart from the upper surface of the polishing pad 102 to supply the slurry when performing the polishing process.

As disclosed herein, because the rotary turntable 101 includes the air inlet tube 201 therein, at the step of performing the CMP process where the slurry is injected onto the polishing pad 102, the carrier head 110 is rotated in a horizontal direction and the rotary turntable 101 is driven, the air, injected from the air inlet tube 201 to the lower part of the polishing pad 102, flows into the slurry. The air that flows into the polishing pad 102 produces slurry bubbles, which relieve damage of the surface of the wafer 103 during the polishing process, thereby reducing scratch formation on the surface of the wafer 103.

Figure 3:
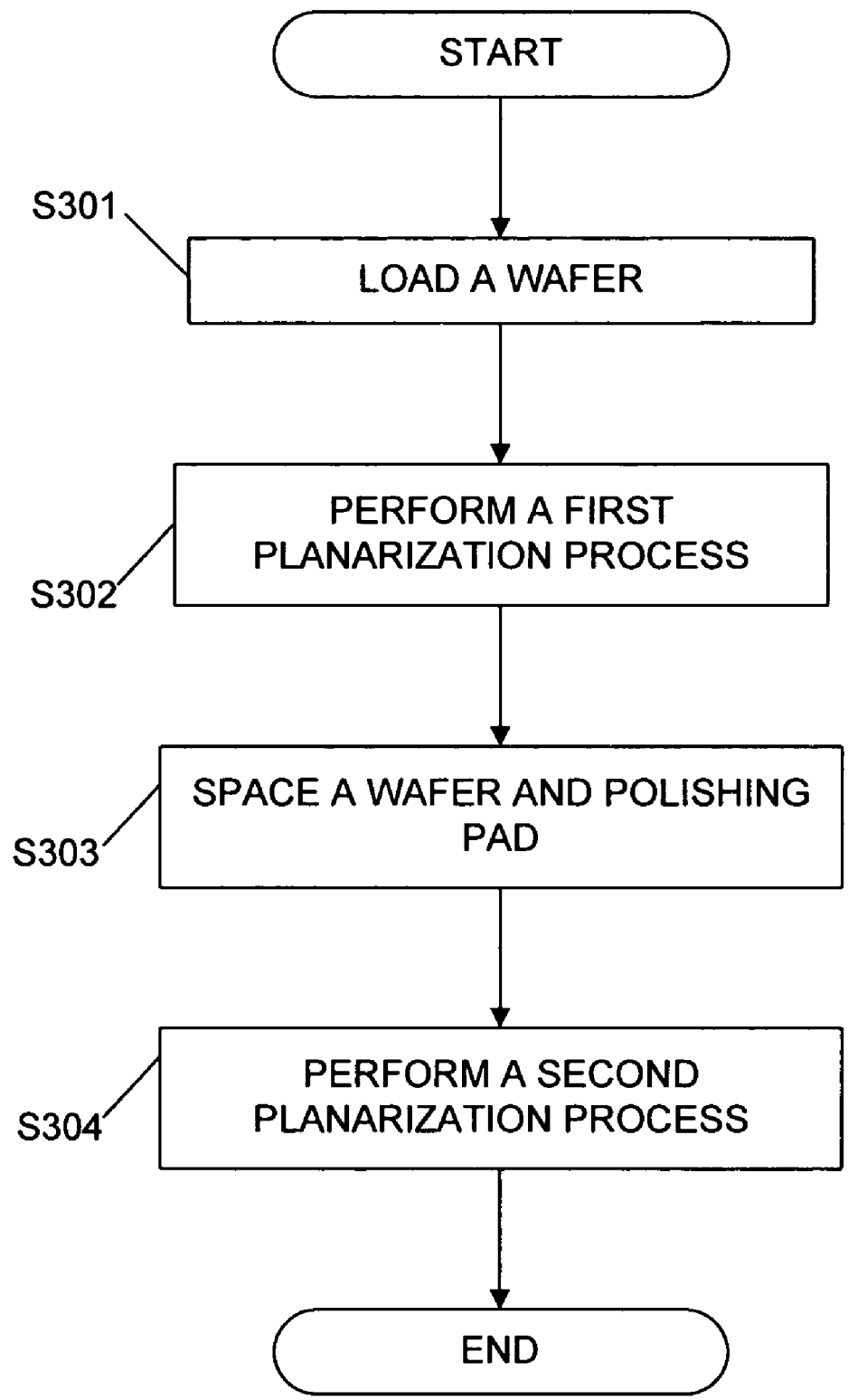
FIG. 3 illustrates an example chemical mechanical polishing method.

One example of the CMP method using one example of the disclosed CMP apparatus will now be described with reference to FIG. 3. As shown in FIG. 3, the wafer 103 is loaded on the CMP apparatus. A term "load" means a state in which the wafer 103 is fixed to the carrier head 110, which may be due to absorption power.

After the wafer 103 is loaded onto the carrier head 110, the slurry is injected onto the polishing pad 102 by the injecting nozzle 130. After the slurry is injected onto the polishing pad 102, the rotary turntable 101 is rotated, and the carrier head 100 fixing the wafer 103 moves until the wafer 103 comes in contact with the polishing pad 102. When the wafer 103 is in contact with the polishing pad 102, the carrier head 100 is rotated and horizontally fluctuated by the driving means (not shown). The above step is herein referred to as a first planarization process. At that time, a diluted mixture of 5 percent weight (wt %) of $CeO_2$ and ultra pure water is utilized as the slurry, in which a diluted ratio is 1:10.

Figure 4:
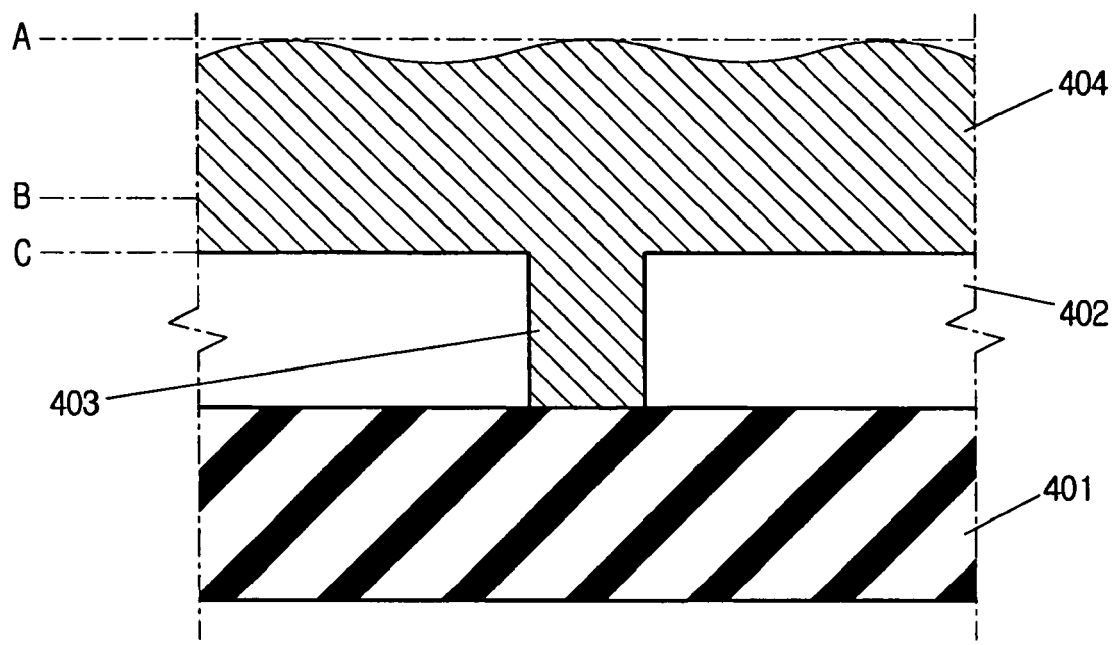
FIG. 4 is a cross-sectional view showing an example of a chemical mechanical polishing method.

A thickness of the wafer 103 polished through the first planarization process is 70 to 80% of a total planarization thickness. Referring to FIG. 4, the total planarization thickness is a length from a point A of a surface of a metal layer 404 to a point C of a surface of an insulating layer 402. The thickness polished by the first planarization process is 70 to 80% of the total planarization thickness, in other words, a length from the point A to a point B.

In the state where the first planarization process is completed, a slurry solution, such as $CeO_2$, is further supplied to the slurry previously deposited on the polishing pad 102 so that an amount of $CeO_2$ in the ultra pure water has a higher concentration than the slurry used in the first planarization process. According to one example, a ratio of $CeO_2$ and ultra pure water for the second planarization process is 1:3 to 1:5. As described below, the second planarization process utilizes the air inlet tube 201 to provide air to the polishing pad 102, thereby producing bubbles in the slurry contained in the polishing pad 102.

After the first planarization process, the carrier head 110 returned to a position spaced apart from the upper surface of the polishing pad 102. During the second planarization process the carrier head 110 is again moved downwardly so that the wafer 103 fixed to the carrier head 110 is almost in contact with the polishing pad 102. At that time, the wafer 103 is spaced apart from the polishing pad 102 by a distance of, for example, 5 to 10 millimeters (mm). The wafer 103 is spaced apart from the polishing pad 102 to prevent the damage of the wafer 103, such as scratching, when performing the polishing process.

When the wafer 103 is spaced from the polishing pad 102 at a given spacing, the second planarization process is performed. As with the first planarization process, the rotary turntable 101 is rotated, and simultaneously, the carrier head is rotated and horizontally fluctuated by the driving means (not shown). At that time, air is injected from the air inlet tube 201 to the slurry on the upper surface of the polishing pad 102, thereby producing bubbles within the slurry. The production of bubbles allows the slurry to coat the wafer 103, which is spaced apart from the polishing pad 102, thereby smoothly inducing the chemical reaction.

The remaining thickness of the wafer 103 after planarizing by the first planarization process, i.e., the pattern of 20 to 30%, is planarized through the second planarization process. Specifically, referring to FIG. 4, the metal layer 404 that remained after the first planarization process is polished from the point B to the point C through the second planarization process.

According to one disclosed example method, the planarization process is performed twice to reduce the risk of scratching the wafer 103. The first planarization process planarizes only 70 to 80% of a predetermined planarization thickness and the remaining thickness is planarized through the second planarization process.

Although certain apparatus constructed in accordance with the teachings of the invention have been described herein, the scope of coverage of this patent is not limited thereto. On the contrary, this patent covers every apparatus, method, and article of manufacture fairly falling within the scope of the appended claims either literally or under the doctrine of equivalents.

The entire disclosure of Korean Patent Application No. 10-2002-0086888 filed on Dec. 30, 2002 including specification, claims, drawings, and summary are incorporated herein by reference in its entirety.

What is claimed is:

1. A chemical mechanical polishing (CMP) method of planarizing a pattern of a wafer by rotating the wafer that is fixed to a carrier head, on a polishing pad by pressing the wafer against the polishing pad and injecting slurry onto the polishing pad, the method comprising:
    performing a first planarization process by injecting the slurry onto the polishing pad and rotating the wafer as the wafer contacts the polishing pad; and
    performing a second planarization process during which the wafer is spaced apart from the polishing pad at a given spacing, wherein air is injected into the polishing pad to produce bubbles in the slurry on the polishing pad while the wafer is rotated.

2. A chemical mechanical polishing method as defined by claim 1, wherein in the second planarization process, a concentration of the slurry on the polishing pad is higher than that of the slurry used in the first planarization process.

3. A chemical mechanical polishing method as defined by claim 1, wherein the spacing between the wafer and the polishing pad is 5 to 10 mm.

4. A chemical mechanical polishing method as defined by claim 2, wherein the concentration of the slurry used in the second planarization process is 2 to 3 times higher than that of the slurry used in the first planarization process.

5. A chemical mechanical polishing method as defined by claim 1, wherein a pattern thickness of the wafer polished through the first planarization process is 70 to 80% of a total planarization thickness.

* * * * *